United States Patent
Yoshigai et al.

(10) Patent No.: US 6,191,045 B1
(45) Date of Patent: Feb. 20, 2001

(54) METHOD OF TREATING SURFACE OF SAMPLE

(75) Inventors: Motohiko Yoshigai, Hikari; Hiroshi Hasegawa; Hiroshi Akiyama, both of Kudamatsu; Takafumi Tokunaga, Iruma; Tadashi Umezawa, Ome; Masayuki Kojima, Kokubunji; Kazuo Nojiri, Higashimurayama; Hiroshi Kawakami, Hachioji; Kunihiko Katou, Fussa, all of (JP)

(73) Assignee: Hitachi, Ltd., Tokyo (JP)

( * ) Notice: Under 35 U.S.C. 154(b), the term of this patent shall be extended for 0 days.

(21) Appl. No.: 09/302,438

(22) Filed: Apr. 30, 1999

(30) Foreign Application Priority Data

May 12, 1998 (JP) .................................................. 10-128445

(51) Int. Cl.$^7$ ..................................................... H01L 21/00
(52) U.S. Cl. .......................... 438/714; 438/715; 438/719; 438/720; 438/738; 216/72; 216/75; 216/79
(58) Field of Search ..................................... 438/710, 712, 438/714, 715, 719, 720, 735, 738, 742; 216/2, 67, 72, 75, 79

(56) References Cited

U.S. PATENT DOCUMENTS 4,886,571 * 12/1989 Suzuki et al. ..................... 156/345 X

OTHER PUBLICATIONS

"Semiconductor Process Handbook", supervised by Yasuo Tarui, Press Journal, pp. 92–93.

* cited by examiner

Primary Examiner—William Powell
(74) Attorney, Agent, or Firm—Antonelli, Terry, Stout & Kraus, LLP.

(57) ABSTRACT

In order to provide a method of treating a multilayer including metal and polysilicon for use in a conductor or a gate electrode of a semiconductor device with high accuracy at a high selectivity, the temperature of a sample is maintained at 100° C. or higher at the time of etching a metal film to increase the etch rate of the metal film. In order to suppress the etch rate of a polysilicon film and prevent side etching, an oxygen gas is added to a gas containing a halogen element. In order to suppress the etch rate of a silicon oxide film at the time of etching the polysilicon film, the etching is performed with etch parameters which are divided into those for the metal film and those for the polysilicon film. In the etching performed to the multilayer containing metal and polysilicon, by etching the metal film at a high temperature of 100° C. or higher, the etch rate of the metal film becomes high. Consequently, there is no partial etch residue of the metal film and a barrier film. By switching the parameters to those with which the polysilicon film can be etched at a high selectivity with respect to an oxide film at the time point of completion of etching to the barrier film, very accurate treatment can be realized.

18 Claims, 5 Drawing Sheets

TEMPERATURE OF SAMPLE : 20°C

TEMPERATURE OF SAMPLE : 80°C

TEMPERATURE OF SAMPLE : 150°C

METHOD OF TREATING SURFACE OF SAMPLE

BACKGROUND OF THE INVENTION

1. Field of the Invention

The present invention relates to a method of treating the surface of a sample such as a semiconductor device and, more particularly, to a sample surface treating method of performing etching by using a plasma.

2. Related Background Art

For etching a semiconductor device, a system utilizing a plasma is widely used. The invention is applied to such a system using the plasma. Conventionally, as a plasma for etching a tungsten film, fluorine gas, chlorine gas, bromine gas, or a mixed gas of those gases is used as described in "Semiconductor Process Handbook", supervised by Yasuo Tarui, pp. 92–93, Press Journal.

As a semiconductor device becomes faster and power consumption becomes lower, resistance in a conductive part such as an electrode and a wire part has to be made lower. Consequently, in order to form a gate electrode of a MOS (Metal Oxide Semiconductor) device, which conventionally employs a polysilicon film, a polysilicon film is formed on a silicon oxide film, and a tungsten film is formed on the polysilicon film. Further, in order to suppress counter diffusion, a barrier film such as a tungsten nitride film is necessary between the polysilicon film and the tungsten film.

When the films having such a multilayer structure are etched, a problem which does not occur conventionally arises due to an etch reaction difference between polysilicon and tungsten. For example, in case of applying a fluorine gas as an etching gas, since the etch rate of polysilicon is faster, it is difficult to suppress the etch rate of the polysilicon film after etching the tungsten film. The silicon oxide film is therefore exposed to a fluorine gas plasma and etched. In case of applying the chlorine gas as an etching gas, since the etch rate of tungsten is slower, the tungsten film or the barrier film remains partially on the polysilicon film. A problem such as occurrence of roughness on the etch surface arises. It is known that means of increasing the etch rate of the tungsten film by the chlorine gas plasma can be improved by increasing the temperature of a sample. Since the temperature of the sample is high at the time of performing etching to the polysilicon film after completion of the etching to the tungsten film, there is a problem such that the etching develops isotropically and side etching occurs.

SUMMARY OF THE INVENTION

It is an object of the invention to solve the problems and to provide a sample surface treating method adapted to treat a sample having a multilayer which is deposited on a semiconductor substrate and includes at least a metal film and a semiconductor film.

In order to achieve the object, according to a feature of the present invention, there is provided a method of treating a sample having a multilayer which is deposited on a semiconductor substrate and includes at least a metal film and a semiconductor film by using a surface treating system comprising: a vacuum chamber; means for generating a plasma in the chamber; a stage on which a sample to be subjected to surface treatment with the plasma is placed; a temperature controlling mechanism for controlling the temperature of the stage; and a power supply for applying an rf (radio frequency) voltage to the stage, wherein the sample is maintained at a temperature from 100° C. to 200° C. at the time of treating the metal film.

In the invention, by etching the metal film while maintaining the sample at a temperature from 100° C. to 200° C., the etch rate of the metal film is increased.

Further, according to another feature of the invention, in order to suppress the etch rate of the polysilicon film and prevent the side etching, an oxygen gas is added to a gas containing a halogen element.

According to further another feature of the invention, the process of treating the multilayer is divided into a plurality of steps in which the sample temperatures are set to different values. More specifically, in order to suppress the etch rate of the silicon oxide film at the time of etching of the polysilicon film, the treatment is carried out by using etch parameters which are divided into at least metal film etch parameters and polysilicon film etch parameters.

DETAILED DESCRIPTION OF THE PREFERRED EMBODIMENTS

First Embodiment

Figure 1A:
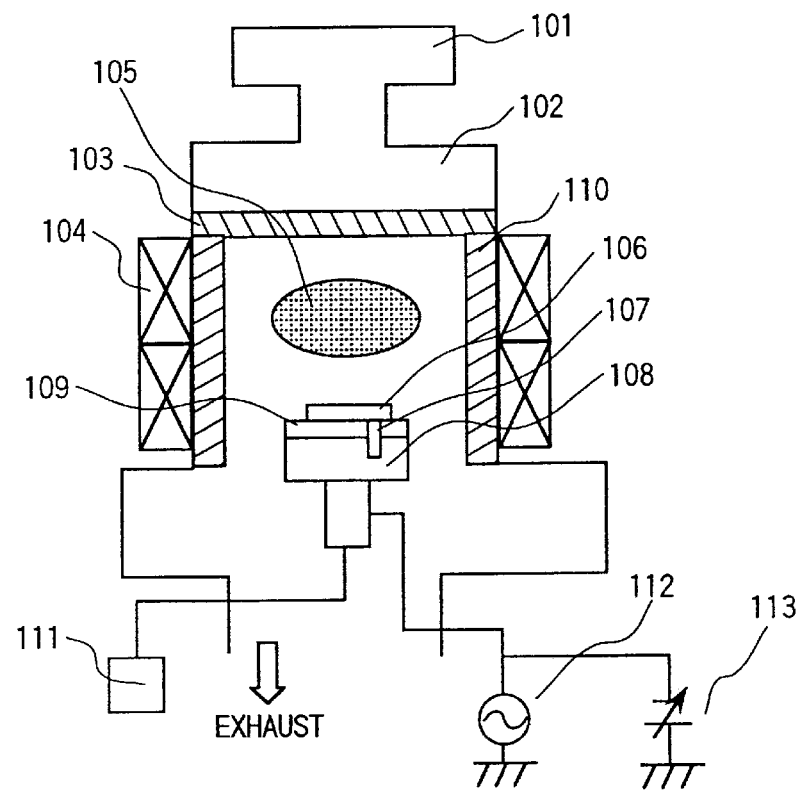
FIG. 1A is a diagram showing the construction of a plasma etching treatment chamber according to an embodiment of the invention.
Figure 1B:
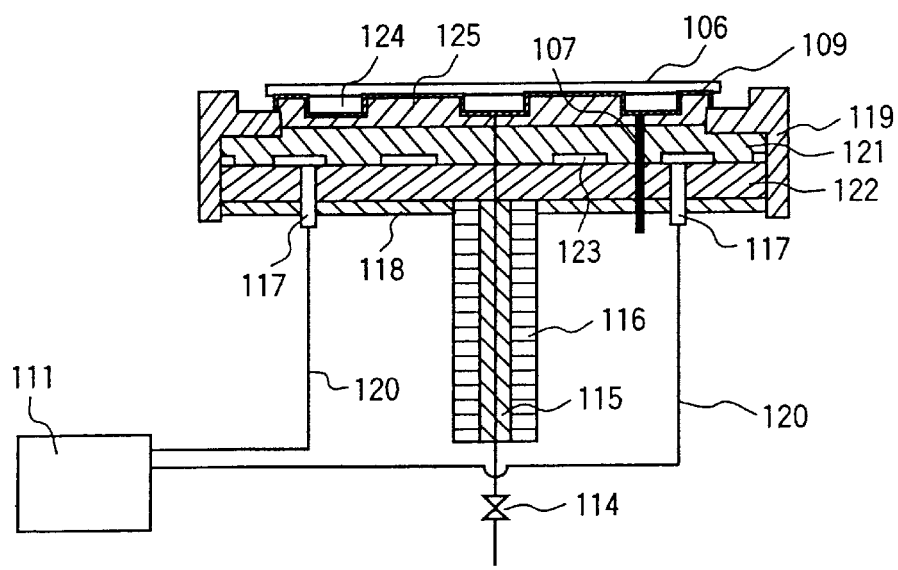
FIG. 1B is a diagram showing a detailed construction of a stage part of FIG. 1.

A first embodiment will be described hereinbelow with reference to the drawings. FIG. 1A is a diagram showing the construction of an etching chamber of a plasma etching system to which the invention is applied. FIG. 1B is a diagram showing the detailed construction of a stage part of FIG. 1A. Microwaves are introduced from a microwave power supply 101 into a chamber 110 via a waveguide 102 and a quartz plate 103. Coils 104 are disposed around the chamber 110 and a plasma 105 is generated by using electron cyclotron resonance between a magnetic field and microwaves. A sample 106 is placed on a stage 108 via a dielectric film 109. An rf (radio frequency) power supply 112, a DC power supply 113, and a coolant temperature controller 111 for adjusting the temperature of the sample are connected to the stage 108. The coolant temperature controller 111 regulates the flow of a coolant circulating in air gaps formed in the stage to thereby control the temperature of the stage. A Coulomb's force is generated between the dielectric film 109 and the sample 106 by a DC voltage applied by the DC power supply 113 to electrostatically attract the sample 106 to the stage 108, and the temperature of the sample 106 is controlled. Further, a temperature sensor 107 is disposed in the stage 108 to monitor the temperature of the sample 106.

As shown in FIG. 1B, the sample arranging side of the stage is covered with the dielectric film 109 and the back surface side of the stage is covered with an insulating plate 118. The heated or cooled coolant is circulated in air gaps 123 formed between an intermediate electrode member 121 and a lower electrode member 122 via coolant introducing nozzles 117 and pipes 120. By controlling the temperature and the circulation amount of the coolant by the coolant temperature controller 111, the temperature of the intermediate electrode member 121 and also that of the upper electrode member 125 are controlled. Powers from the rf power supply 112 and the DC power supply 113 are applied to the lower electrode via a shaft 115 coated with an insulating film 116. The upper electrode member 125 coated with the dielectric film 109 has air gaps 124. An inactive gas such as helium gas is introduced to the air gaps 124 via a pipe having a valve 114. The inactive gas facilitates thermal conduction from the upper electrode member 125 to the sample 106 which is placed on the upper electrode member 125.

Further, by temperature monitoring using the temperature sensor, it is possible to start etching after the temperature of the sample 106 reaches a desired temperature, or to detect an abnormality in a sample temperature during etching treatment.

Figure 2A:
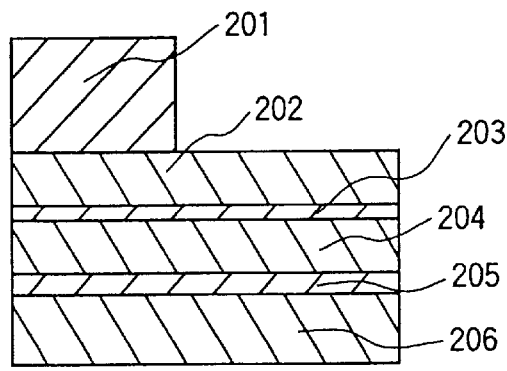
FIGS. 2A to 2C are cross sections of a sample showing a change in an etching state.
Figure 2B:
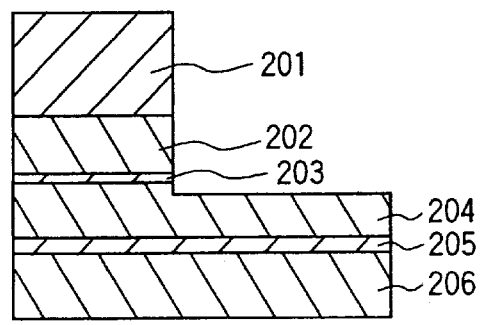
Figure 2C:
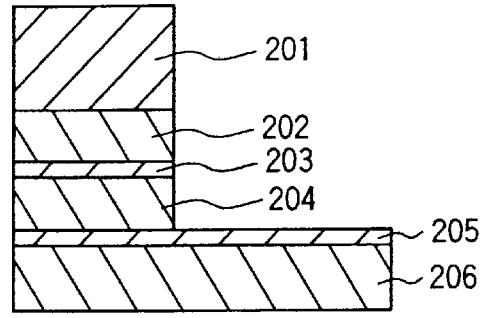

FIGS. 2A to 2C are cross sections of the sample. In the initial state as shown in FIG. 2A, a multilayer of an oxide film 205, a polysilicon film 204, a tungsten nitride film 203, and a tungsten film 202 is deposited on a silicon substrate 206, and a mask 201 treated in a desired pattern is formed as an uppermost layer.

A specific treating procedure will be described. The sample 106 is placed on the stage 108 heated to 150° C. by the coolant temperature controller 111 of the stage temperature control mechanism and attracted to the stage 108 by using a DC voltage applied from the DC power supply 113. Simultaneously, the plasma 105 is generated by an inactive gas of argon or helium to increase the temperature of the sample 106. After it is checked that the temperature of the sample is at a desired temperature using the temperature sensor 107, the generation of the plasma 105 is stopped. After that, the gas is replaced by an etching gas. Upon generation of the plasma 105, the rf power from the rf power supply 112 is applied to accelerate ions impinging on the sample 106, thereby etching the tungsten film 202, the tungsten nitride film 203, and the upper layer part of the polysilicon film 204 to the state of FIG. 2B. The etch parameters are: the etching gas made from 40 ml/min. of chlorine and 10 ml/min. of oxygen, pressure of 0.2 Pa, the microwave power of 500 W, the sample temperature of 150° C., and the rf power of 100 W.

Figure 5A:
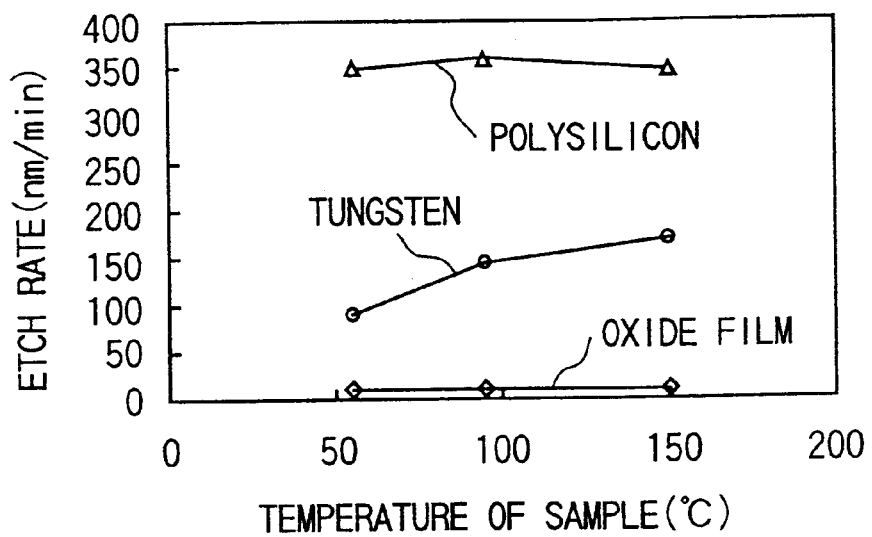
FIG. 5A is a diagram showing an example of sample temperature dependencies of etch rates of a tungsten film, a polysilicon film, and an oxide film when an etching gas made from chlorine and oxygen is used.

FIG. 5A shows an example of sample temperature dependencies of the etch rates of the tungsten film, the polysilicon film, and the oxide film when an etching gas made from chlorine and oxygen is used. By performing the etching with the plasma of chlorine and oxygen at a high temperature, the etch rate of the tungsten film can be increased without increasing the etch rate of the polysilicon film. Thus, the polysilicon film can be left without a partial etch residue of the tungsten film and the tungsten nitride film.

The etching is performed to the state of FIG. 2C with the etch parameters that the etching gas made from 100 ml/min. of hydrogen bromide and 5 ml/min. of oxygen is used, the pressure is set to 1 Pa, the microwave power is set to 500 W, the sample temperature is set to 150° C., and the rf power is set to 30 W. As the embodiment, by etching the tungsten film at a high temperature of 100° C. or higher, the polysilicon film can be left without an etch residue of the tungsten film and the barrier film. The parameters are changed to those with which the polysilicon film can be etched at a high selectivity with respect to the oxide film. In such a manner, very accurate treatment can be performed.

Second Embodiment

Figure 3:
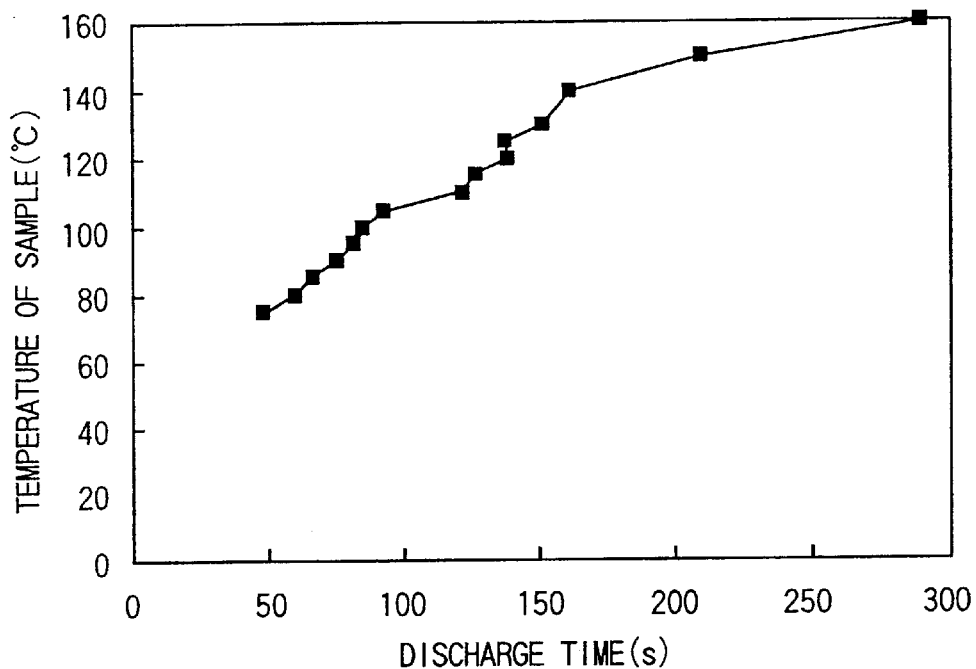
FIG. 3 is a diagram showing a change with time of the temperature of a sample when the temperature of the sample is increased by using a plasma.

An example of treating the multilayer by using the plasma etching system shown in FIG. 1 in a manner similar to the first embodiment will be described. A coolant cooled to 20° C. by the coolant temperature controller 111 is circulated in the stage 108. The sample 106 is placed on the stage 108 without electrostatically attracting it. In this state, contact between the sample 106 and the stage 108 is very small, and accordingly heat transfer from the sample to the stage or from the stage to the sample is suppressed. A plasma is generated with discharge parameters of 100 ml/min. of argon gas, 1 Pa of pressure, and 500 W of microwave power to heat the sample 106 to 150° C. FIG. 3 shows the temperature change of the sample 106 in this case.

After that, under conditions of using an etching gas of chlorine and oxygen as described in the first embodiment and heating the sample, the sample 106 is treated while the state of FIG. 2B is being kept. Then, a DC voltage is applied from the DC power supply 113 to electrostatically attract the sample 106 to the stage 108. In this state, contact between the sample 106 and the stage 108 becomes firm, and the heat transfer is improved. The sample 106 is cooled to 20° C. and treated to the state of FIG. 2C with the parameter of using an etching gas made from hydrogen bromide and oxygen described in the first embodiment.

Figure 5B:
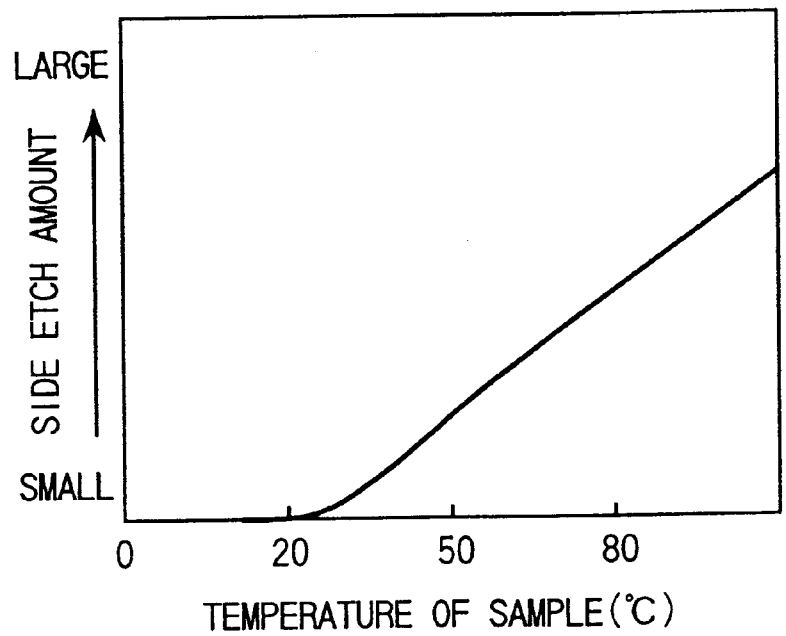
FIG. 5B is a diagram showing an example of the relation between a side etch amount of the polysilicon film and the temperature of the sample.
Figure 6A:
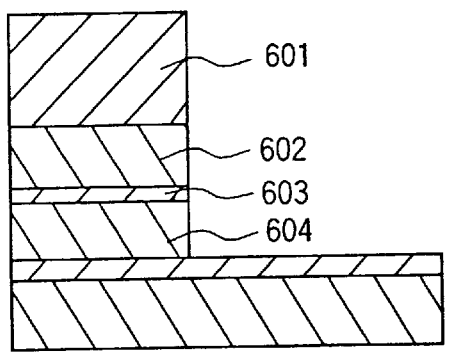
FIGS. 6A to 6C show an example of sample temperature dependencies of etch profiles when the polysilicon film is etched with an etching gas made from hydrogen bromide and oxygen.
Figure 6B:
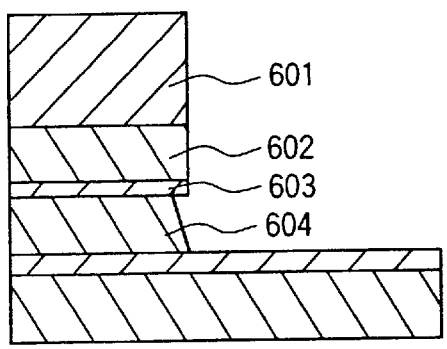
Figure 6C:
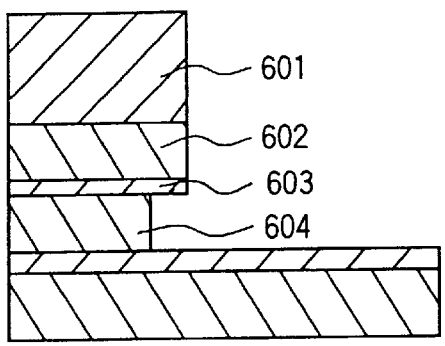

FIGS. 6A to 6C show an example of sample temperature dependencies of the etch profile when the polysilicon film is etched with an etching gas made from hydrogen bromide and oxygen. FIG. 5B is a graph showing an example of the relation between the side etch amount of the polysilicon film and the sample temperature. As shown in FIG. 5B, when the sample temperature exceeds about 30° C., the side etch amount tends to increase with the rise in the sample temperature. In the etching of the polysilicon film, therefore, it is desirable to make the sample temperature low in order to avoid the side etch.

FIG. 6A shows the embodiment of the invention in which the sample temperature is set to 20° C. and the polysilicon film is etched. FIGS. 6B and 6C show comparative examples in which the sample temperatures are 80° C. and 150° C., respectively.

As the embodiment, by treating the tungsten film at a high temperature, for example, 100° C. to 200° C., and treating the polysilicon film at a low temperature, for example, 0° C. to 80° C., excellent treatment accuracy without partial etch residue of the tungsten film or the tungsten nitride film and without side etch in the polysilicon film can be obtained, as shown in FIG. 6A.

Third Embodiment

Figure 4:
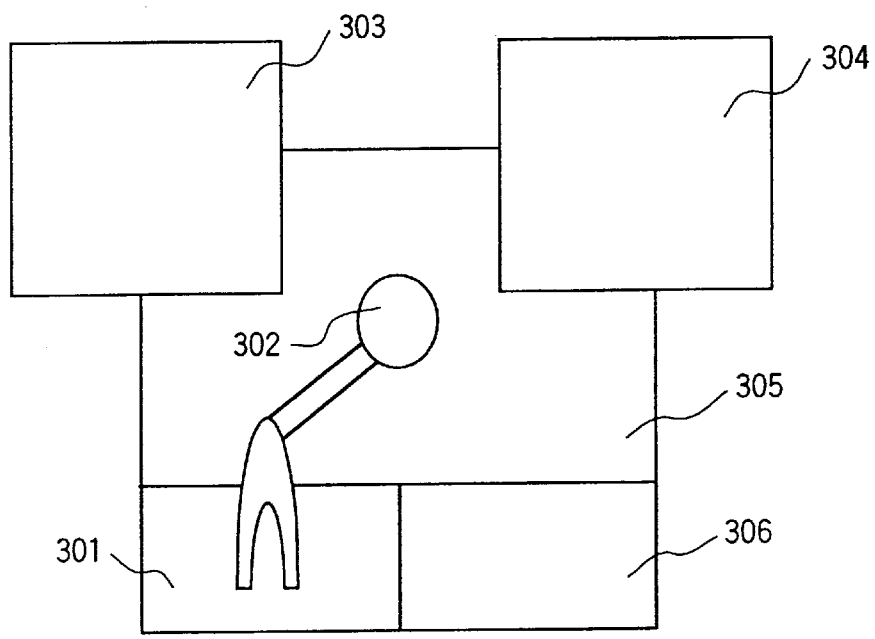
FIG. 4 is a diagram showing a whole construction of a system comprising a plurality of plasma etching chambers to which the invention is applied.

FIG. 4 shows a system comprising a plurality of plasma treatment chambers to which the invention is applied. The system comprises: a sample load-in chamber 301; an evacuated buffer chamber 305; a transfer robot 302 for transferring the sample to each chamber; and an A treatment chamber 303 and a B treatment chamber 304 each having a construction similar to that of FIG. 1 for treating the surface of the sample with the plasma. The sample is loaded into the A treatment chamber 303 via the load-in chamber 301 by the transfer robot 302, placed on the sample stage 108 heated to 150° C., and electrostatically attracted, thereby promptly increasing the sample temperature to 150° C. The sample is etched to the state of FIG. 2B with the parameter of using the etching gas made from chlorine and oxygen described in the first embodiment. After that, the sample to be treated is loaded into the B treatment chamber 304 by the transfer robot 302, placed on the sample stage 108 cooled to 20° C., and electrostatically attracted, thereby promptly decreasing the sample temperature to 20° C. The sample is etched to the state of FIG. 2C with the parameter of using the etching gas made from hydrogen bromide and oxygen described in the first embodiment.

As the embodiment, by continuously treating the tungsten film and the polysilicon film in the treatment chambers having the sample stages controlled at different temperatures, the excellent process without the partial etch residue of the tungsten film or the tungsten nitride film and without side etch in the polysilicon film can be efficiently carried out.

As described above, according to the invention, in the etching performed to the multilayer including the metal film and the polysilicon film, by etching the metal film at a high temperature of 100° C. to 200° C., the etch rate of the metal film becomes high. Then, the parameters are switched to those with which the polysilicon film can be etched at a high selectivity with respect to the oxide film upon completion of the etching to the barrier film without partial etch residue of the metal film and the barrier film, thereby realizing very accurate etching.

What is claimed is:

1. An etching method, comprising:
   providing a material having thereon a multi-layer film composed of a lamination of a semiconductor film and a metallic film; and
   etching said multi-layer film with a plasma of a halogen-containing gas, wherein the material having said multi-layer film thereon is kept at a temperature over 100° C. during etching of said metallic film.

2. An etching method according to claim 1, wherein said halogen-containing gas is a mixed gas comprising mixture of at least an atomic halogen-containing gas and an oxygen-containing gas.

3. An etching method according to claim 1, wherein said semiconductor film is a polycrystalline silicon film and said metallic film is a tungsten film.

4. An etching method according to claim 3, wherein said multi-layer film further comprises a barrier film that is located between said semiconductor film and said metallic film, and said barrier film is comprised of a tungsten nitride film or of a titanium nitride film.

5. An etching method, comprising:
   providing a material having thereon a multi-layer film composed of a lamination of a semiconductor film and a metallic film; and
   etching said multi-layer film, including the metallic film and the semiconductor film, with a plasma of a halogen-containing gas, wherein said material having said multi-layer film thereon is kept at a temperature over 100° C. when said metallic film is being etched, and said material is kept at a temperature below 80° C. when said semiconductor film is being etched.

6. An etching method according to claim 5, wherein said halogen-containing gas is a mixed gas comprising a mixture of at least an atomic halogen-containing gas and an oxygen-containing gas.

7. An etching method according to claim 5, wherein said semiconductor film is a polycrystalline silicon film and said metallic film is a tungsten film.

8. An etching method according to claim 7, wherein said multi-layer film further comprises a barrier film that is located between said semiconductor film and said metallic film, and said barrier film is comprised of a tungsten nitride film or of a titanium nitride film.

9. An etching method according to claim 8, wherein said halogen-containing gas is a mixed gas of chlorine and oxygen when said metallic film and said barrier film are being etched, and is a mixed gas of hydrogen bromide and oxygen when said semiconductor film is being etched.

10. An etching method, comprising:
    providing a material having thereon a multi-layer film composed of a lamination of a semiconductor film, a barrier film, and a metallic film; and
    etching said multi-layer film with a plasma of a halogen-containing gas, wherein the material having said multi-layer film thereon is kept at a temperature between 100° C. and 200° C. during etching of said metallic film and said barrier film, and said material is kept at a temperature of 0° C. to 80° C. during etching of said semiconductor film.

11. An etching method according to claim 10, wherein said semiconductor film is a polycrystalline silicon film, said barrier film is a tungsten nitride film or a titanium nitride film, and said metallic film is a tungsten film.

12. An etching method according to claim 11, wherein said halogen-containing gas is a mixed gas of chlorine and oxygen when said tungsten film and said barrier film are being etched, and is a mixed gas of hydrogen bromide and oxygen when said polycrystalline silicon film is being etched.

13. An etching method, comprising:
    providing a material having thereon a multi-layer film composed of a lamination of a semiconductor film, a barrier film, and a metallic film; and
    etching said multi-layer film, including said metallic film, said barrier film and said semiconductor film, with a plasma of a halogen-containing gas, wherein said material having said multi-layer film thereon is placed on a first worktable maintained at a temperature over 100° C. in a first processing chamber when the metallic film and barrier film are being etched, followed by transferring the material into a second processing chamber through a buffer chamber evacuated for vacuum to allow etching of said semiconductor film, the material being placed on a second worktable maintained at a temperature below 80° C. in said second processing chamber.

14. An etching method according to claim 13, wherein said semiconductor film is a polycrystalline silicon film, said barrier film is a tungsten nitride film or a titanium nitride film, and said metallic film is a tungsten film.

15. An etching method according to claim 14, wherein said halogen-containing gas is a mixed gas of chlorine and oxygen when said tungsten film and barrier film are being etched, and the halogen-containing gas is a mixed gas of hydrogen bromide and oxygen when said polycrystalline silicon is being etched.

16. An etching method, comprising:
provic a material having thereon a multi-layer film composed of a lamination of a semiconductor film, a barrier film, and a metallic film; and
etching said multi-layer film, including the semiconductor film, the barrier film and the metallic film, with a plasma of a halogen-containing gas, wherein the material having said multi-layer film thereon is placed on a first worktable maintained at a temperature between 100° C. and 200° C. in a first processing chamber during etching of the metallic film and the barrier film, followed by transferring the material into a second processing chamber through a buffer chamber evacuated for vacuum to allow etching of said semiconductor film, the material being placed on a second worktable maintained at a temperature between 0° C. and 80° C. in said second processing chamber.

17. An etching method according to claim 16, wherein said semiconductor film is a polycrystalline silicon film, said barrier film is a tungsten nitride film or a titanium nitride film, and said metallic film is a tungsten film.

18. An etching method according to claim 17, wherein said halogen-containing gas is a mixed gas of chlorine and oxygen when said tungsten film and barrier film are being etched, and is a mixed gas of hydrogen bromide and oxygen when said polycrystalline silicon is being etched.

* * * * *